(12) United States Patent
Midya et al.

(10) Patent No.: US 6,348,781 B1
(45) Date of Patent: Feb. 19, 2002

(54) BUCK OR BOOST POWER CONVERTER

(75) Inventors: Pallab Midya, Schaumburg; Lawrence E. Connell, Naperville; Kenneth R. Haddad, Arlington Heights, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/733,722

(22) Filed: Dec. 11, 2000

(51) Int. Cl.[7] .......................... G05F 1/613; G05F 1/40; G05F 1/656
(52) U.S. Cl. ...................... 323/224; 323/283; 323/259; 323/222
(58) Field of Search ............................ 323/222, 224, 323/282, 283, 259

(56) References Cited

U.S. PATENT DOCUMENTS

| 4,184,197 | A | | 1/1980 | Cuk et al. ..................... 363/16 |
| 5,319,536 | A | * | 6/1994 | Malik ........................... 363/65 |
| 5,359,280 | A | * | 10/1994 | Canter et al. ................ 323/282 |
| 5,477,132 | A | * | 12/1995 | Canter et al. ................ 323/282 |
| 5,528,125 | A | * | 6/1996 | Marshall et al. ............. 323/222 |
| 5,714,863 | A | * | 2/1998 | Hwang et al. ............... 363/101 |
| 5,894,243 | A | * | 4/1999 | Hwang ........................ 327/540 |
| 6,037,755 | A | * | 3/2000 | Mao et al. ................... 323/222 |
| 6,166,527 | A | * | 12/2000 | Dwelley et al. ............. 323/222 |

OTHER PUBLICATIONS

Understanding Buck–Boost Power Stages in Switchmode Power Supplies, Texas Instruments, Mixed Signal Products SLVA059, Mar. 1999.

* cited by examiner

Primary Examiner—Bao Q. Vu
(74) Attorney, Agent, or Firm—Scott M. Garrett; James A. Lamb

(57) ABSTRACT

A buck or boost (BOB) power converter circuit. A buck converter is cascaded with a boost converter to form a buck or boost circuit (20). The BOB converter is controlled by a controller (26) such that only the buck or boost converter is operating at any given time. A reference signal $V_{ref}$ can be applied to the controller (26) such that the output voltage from the converter closely tracks the reference signal. Positive and negative ramp signals are generated and an error feedback signal is compared with the ramp signals to control the output in accord with $V_{ref}$. This is useful in application of the output voltage as the power supply to an RF Power Amplifier (16) so that the reference signal can represent the envelope of a signal to be transmitted and the RF PA (16) can operate at high efficiency.

9 Claims, 9 Drawing Sheets

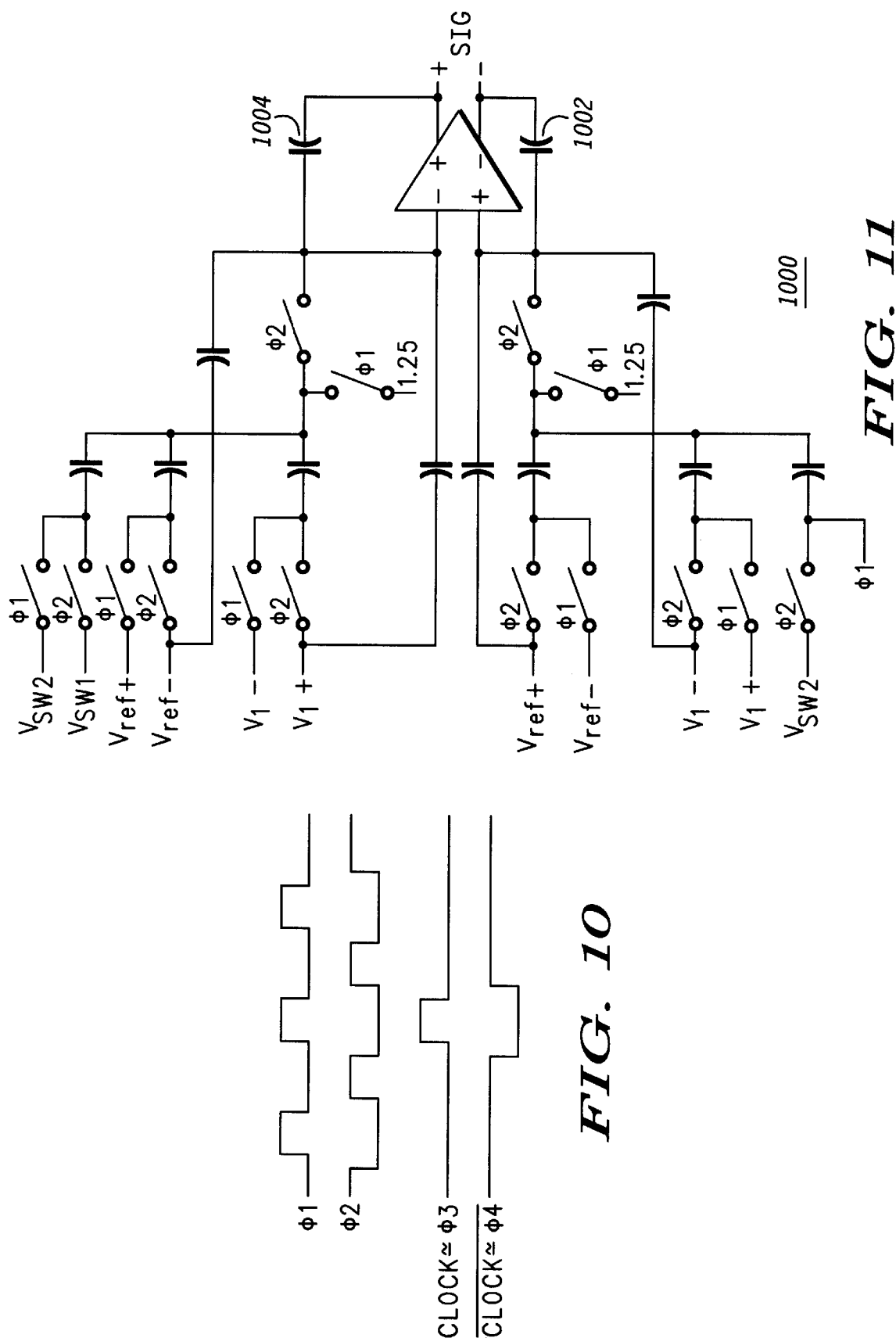

BUCK OR BOOST POWER CONVERTER

FIELD OF THE INVENTION

This invention relates generally to the field of power converters. More particularly, the present invention relates, in certain embodiments, to a Buck or Boost power converter providing high conversion efficiency especially suitable for cellular telephones, selective call two way radios and other battery powered devices.

BACKGROUND OF THE INVENTION

As more people become dependent upon battery powered devices such as radios and cellular telephones, high efficiency in the electronics powering such devices becomes increasingly important. For example, in the case of cellular telephones, size and talk time have become critical features. It is possible to improve the talk time and/or reduce size of a cellular telephone by improving the efficiency of the RF transmitter. The efficiency of the RF transmitter can be substantially increased by using an optimal supply voltage based on the instantaneous envelope of the RF signal being transmitted. Cellular telephones typically use batteries such as lithium ion batteries which range from approximately 4.5 V to 2.75 V output based on the state of charge of the battery. It is therefore highly desirable to have a power converter within such a cellular telephone that provides a voltage both higher and lower than the battery voltage. This permits the radio transmitter circuit to most efficiently transmit the RF signal by adjusting the voltage to the RF power amplifier to track the envelope of the RF signal being transmitted.

Such power conversion can be accomplished utilizing known Buck-Boost converters. Unfortunately, known Buck-Boost converters often use many large magnetic elements and have comparatively poor efficiency (typically approximately 80%). In such known Buck-Boost converters, a switching signal with a controllable duty cycle D drives cascaded Buck and Boost circuits to producer an output voltage which a function of the duty cycle. In addition to comparatively poor efficiency, known Buck-Boost converters typically invert the polarity of the output voltage. Those converters known to not convert the polarity of the output voltage frequently have even lower power conversion efficiency.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

FIG. 10 illustrates a four-phase clock used in the switched capacitor implementations of FIG. 8 and FIG. 10.

FIG. 11 illustrates one embodiment of a switched capacitor implementation of an error amplifier.

DETAILED DESCRIPTION OF THE INVENTION

Figure 1:
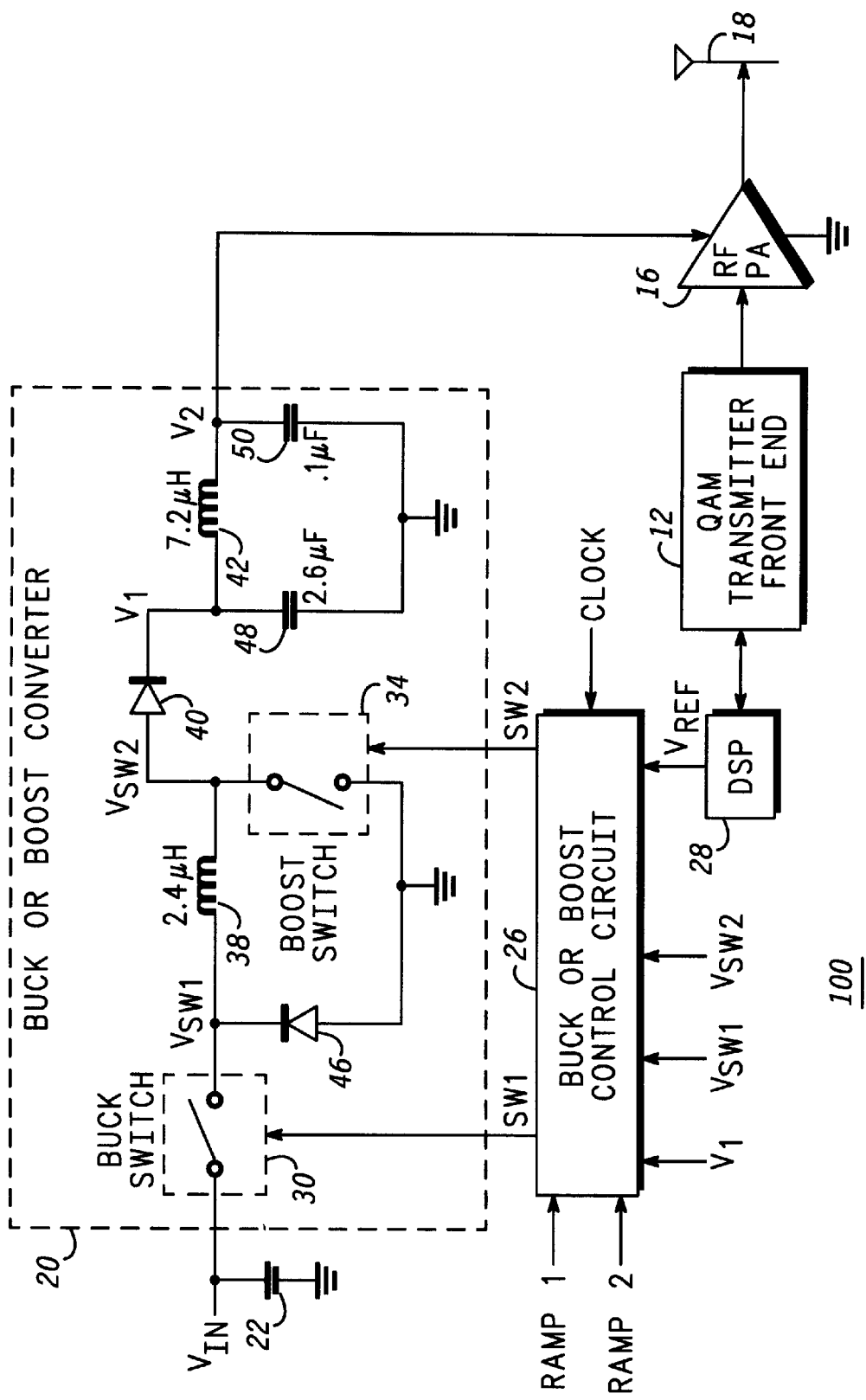
FIG. 1 is a schematic block diagram of a buck or boost power converter circuit arrangement consistent with embodiments of the present invention embodied in an exemplary radio receiver.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Referring now to FIG. 1, the present invention utilizes a power converter circuit referred to as a Buck or Boost converter (or BOB converter for short). Circuit 100 of FIG. 1 illustrates the use of such a Buck or Boost power converter circuit arrangement in the embodiment of an RF transmitter and more particularly an exemplary quadrature amplitude modulated (QAM) radio transmitter. In circuit 100, a QAM transmitter front end 12 drives a radio frequency power amplifier 16, which in turn delivers radio frequency power to an antenna 18. Radio Frequency Power Amplifier (RF PA) 16 is powered by the Buck or Boost power converter 20 which delivers a supply voltage $V_2$ to the RF Power Amplifier 16. Power supply voltage $V_2$ is modulated so that the power supply voltage tracks a signal derived from the baseband signal transmitted by RF power amplifier 16. Buck or Boost converter 20 receives an input voltage $V_{in}$ from a battery 22 and is controlled by a Buck or Boost control circuit 26. The Buck or Boost control circuit 26 receives an input signal $V_{ref}$ from a Digital Signal Processor (DSP) 28. Signal $V_{ref}$ is derived by the digital signal processor from the baseband to be transmitted by the QAM transmitter front end 12.

Buck or Boost control circuit 26 receives input signals RAMP1 and RAMP2 from a Ramp generator (not shown in this figure) as well as a clock signal and three voltages fed back from the Buck or Boost converter $20-V_1$, $V_{sw1}$ and $V_{sw2}$. Buck or Boost control circuit generates two independent switch signals which are delivered to the Buck or Boost converter 20. Buck switch signal $S_{w1}$ is delivered to a Buck switch 30, while Boost switch signal $S_{w2}$ is delivered to a Boost switch 34. Buck switch signal $S_{w1}$ operates with a duty cycle of $D_1$ while Boost switch signal $S_{w2}$ operates with a duty cycle of $D_2$.

Buck or Boost converter 20 is essentially configured as a Buck converter (a voltage converter which reduces a value of an input signal) cascaded with a Boost converter (a voltage converter which increases the value of an input voltage). The Buck and Boost circuits can be configured in any order without departing from the invention. Buck switch 30 and Boost switch 34 are preferably implemented using low on resistance MOSFET power transistors to minimize switching losses. The input voltage from battery 22 $V_{in}$ is applied to series Buck switch 30 which is in turn connected to a series inductor 38, a series diode 40 and another series inductor 42. The anode of diode 40 is connected to inductor 38 while the cathode is connected to inductor 42. A diode 46 is connected from ground to the junction of Buck switch 30 and inductor 38. This junction supplies switching voltage $V_{sw1}$ to Buck or Boost control circuit 26. The Boost switch 34 is connected between ground and the junction of inductor 38 and diode 40. This junction produces the switching voltage $V_{sw2}$ which is supplied to Buck or Boost control circuit 26. A capacitor 48 is connected from the junction of diode 40 and inductor 42 to ground. This junction presents voltage $V_1$ which is also fed to Buck or Boost control circuit 22. Another capacitor 50 is connected from the output ($V_2$) to ground.

In operation, Buck or Boost control circuit 26 at any given instant supplies a switching signal $S_{w1}$ and $S_{w2}$ to the switches. This causes a switched voltage to be applied to a storage element (capacitor or inductor) of Buck or Boost converter 20 to ultimately produce output voltage $V_2$. Whenever the output voltage is required to be greater than the input voltage $V_{in}$, switching signal $S_{w2}$ with duty cycle $D_2>0$ is applied to Boost switch 34 to produce a Boosted output voltage $V_2$. Whenever signal $S_{w2}$ is switching to produce Boosted voltage output, the Buck switch 30 remains in the closed position connecting $V_{in}$ with $V_{sw1}$. In this manner, any losses associated with switching Buck switch 30 are eliminated. In a similar manner, if output voltage $V_2$ is required to be less than $V_{in}$, Buck switch signal $S_{w1}$ is switched with a duty cycle of $D_1$ while Boost switch 34 remains in the open position. In this manner, Buck or Boost converter 20 instantaneously operates as either a Buck converter or a Boost converter. In this manner efficiencies in the range of 90% are readily achieved using off the shelf circuit components. This is in contrast to a Buck-Boost configuration wherein both Buck switches and Boost switches are operating simultaneously and any loss of efficiency inherent in the switching is compounded, often reaching three times the losses of the present invention. Those skilled in the art will recognize that diodes 40 and 46 may be implemented either as actual diodes, or by utilizing transistor switches in order to produce extremely low loss diode action. Diodes 40 and 46 are represented schematically as diodes for ease of understanding the present invention.

Figure 2:
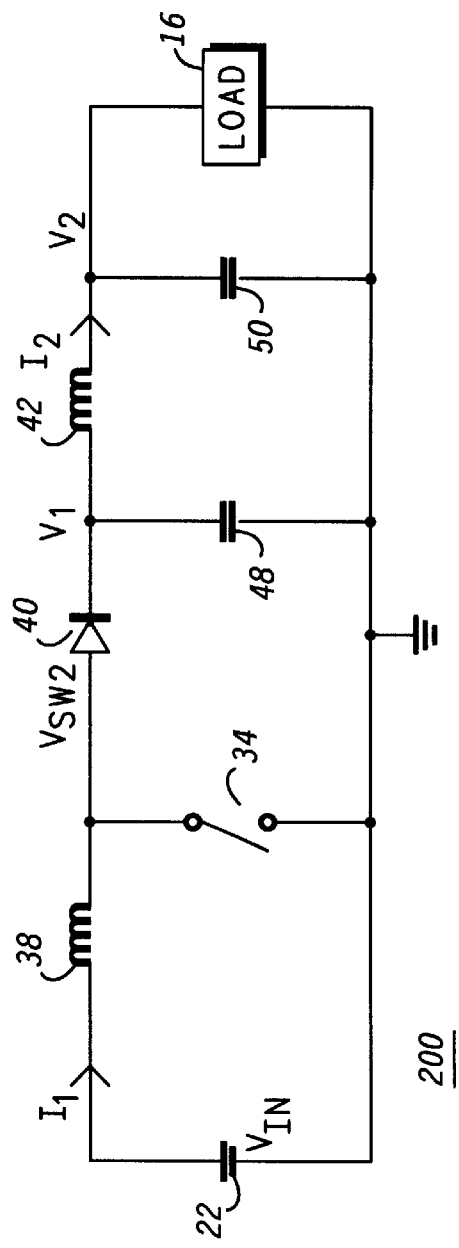
FIG. 2 is an equivalent circuit of the buck or boost power converter of FIG. 1, operating in the boost mode.

Referring now to FIG. 2, an equivalent circuit 200 of Buck or Boost converter 20 operating in the Boost mode is shown. In this mode, Buck switch 30 is closed ($D_1=1$) and diode 46 is reversed biased so that their contribution to the operation of circuit 200 is negligible and do not appear in circuit 200. Load 16 represents any DC load in general, and more particularly for the current embodiment, the load of Radio Frequency Power Amplifier (RF PA) 16. In this mode of operation, as switch 34 is opened and closed with a duty cycle $D_2$, the voltage appearing as $V_{sw2}$ is either at 0.0 volts (ground) when switch 34 is closed or at $V_1$ when switch 34 is open. Thus, $V_{sw2}$ is equal to $V_1$ times the duty cycle $D_2$. Since the average voltage across inductor 38 must be 0.0 volts, the average value of $V_{sw2}$ will equal $V_{in}$. Inductor 42 and capacitor 50 serve as a low pass filter to present a smooth, low ripple DC supply voltage to load 16 (Prototypes have shown ripple of less than 70 dBc). In accordance with the above, $V_1$ and thus $V_2$, is then equal to the average value of $V_{sw2}$ divided by the duty cycle $1-D_2$. Thus, if the duty cycle $D_2$ is equal to 0.5 (meaning the boost switch is closed 50% of the time), then $V_1$ is equal to two times $V_{in}$, and the voltage $V_2$ presented to the load 16 is two times the input voltage $V_{in}$. In this mode of operation (steady state, or during the Boost mode of any cycle), $V_{Out}$ can be approximated by:

$$V_{Out} = V_2 = \frac{V_{in}}{1-D_2}. \quad [1]$$

Figure 3:
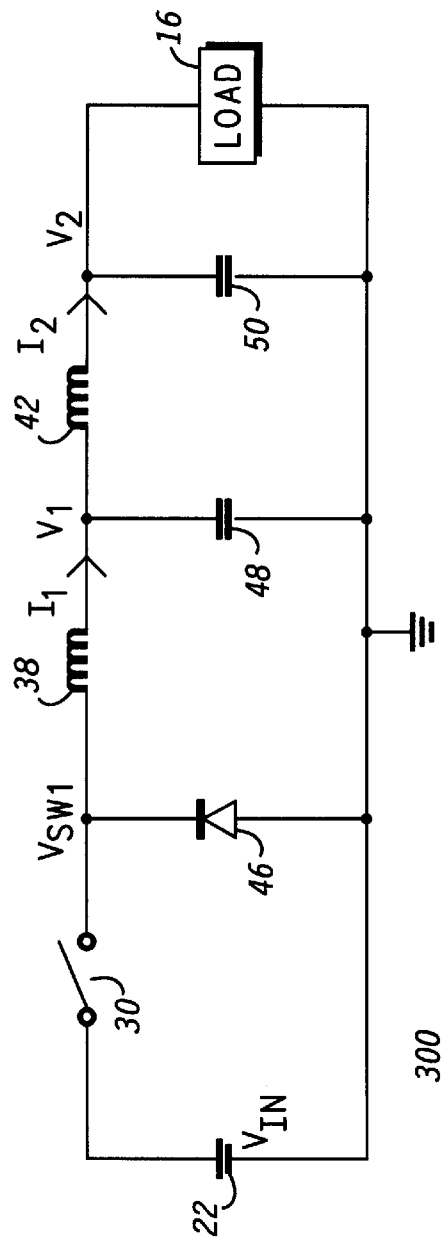
FIG. 3 is an equivalent circuit of the buck or boost power converter of FIG. 1, operating in the buck mode.

Referring now to FIG. 3, circuit 300 is an equivalent circuit of BOB converter 20 operating in the Buck mode. In this mode of operation, switch 34 remains in the open position ($D_2=0$) and diode 40 remains forward biased. Thus, switch 34 and diode 40 do not appear in circuit 300. In operation, when switch 30 is closed, voltage $V_{sw1}$ is equal to $V_{in}$, whereas when switch 30 is open, $V_{sw1}$ is at ground. $V_1$ represents approximately the average voltage of $V_{sw1}$ which, of course, depends upon the duty cycle $D_1$ of the switching signal $S_{w1}$ controlling switch 30. Thus, $V_1$ equals the average value of $V_{sw1}$ and $V_2$ is a low pass filtered version of $V_1$ so that $V_2$ equals $V_{in}\times$duty cycle $D_1$. By way of example, if duty cycle $D_1$ is 0.7 (meaning that switch 30 is closed 70% of the time) then $V_2$ is equal to $0.7\times V_{in}$. In this mode of operation, the output voltage $V_2$ can be approximated by:

$$V_2 = V_{in} \times D_1. \quad [2]$$

Thus, by separately controlling the Buck or Boost functions of circuit 20 of FIG. 1, any Bucked or Boosted voltage $V_2$ can be obtained. Component values shown in FIG. 1 for Buck or Boost converter 200 represent component values that have been utilized in circuitry operating at 1 MHz switching rate for either $S_{w1}$ or $S_{w2}$. Low ripple output voltages at $V_2$ have values ranging from ⅛ to 3 times the voltage $V_{in}$, with $V_{in}$ ranging from approximately 2.75 V to 4.5 V. The converter operated with off the shelf parts provided conversion efficiency of 91% at 1 MHz and 89% at 1.7 MHz. The component values shown in FIG. 1 were selected for fast tracking with low ripple. The bandwidth of the converter with the component values shown is approximately 250 Khz with a tracking delay of only 2.5 microseconds. These component values are given strictly by way of example only and are not intended to be limiting of the scope of the invention.

The output voltage $V_2$ from BOB converter 20, at any given time can be approximated by:

$$V_2 = V_{in}\left(\frac{D_1}{1-D_2}\right). \quad [3]$$

Figure 4:
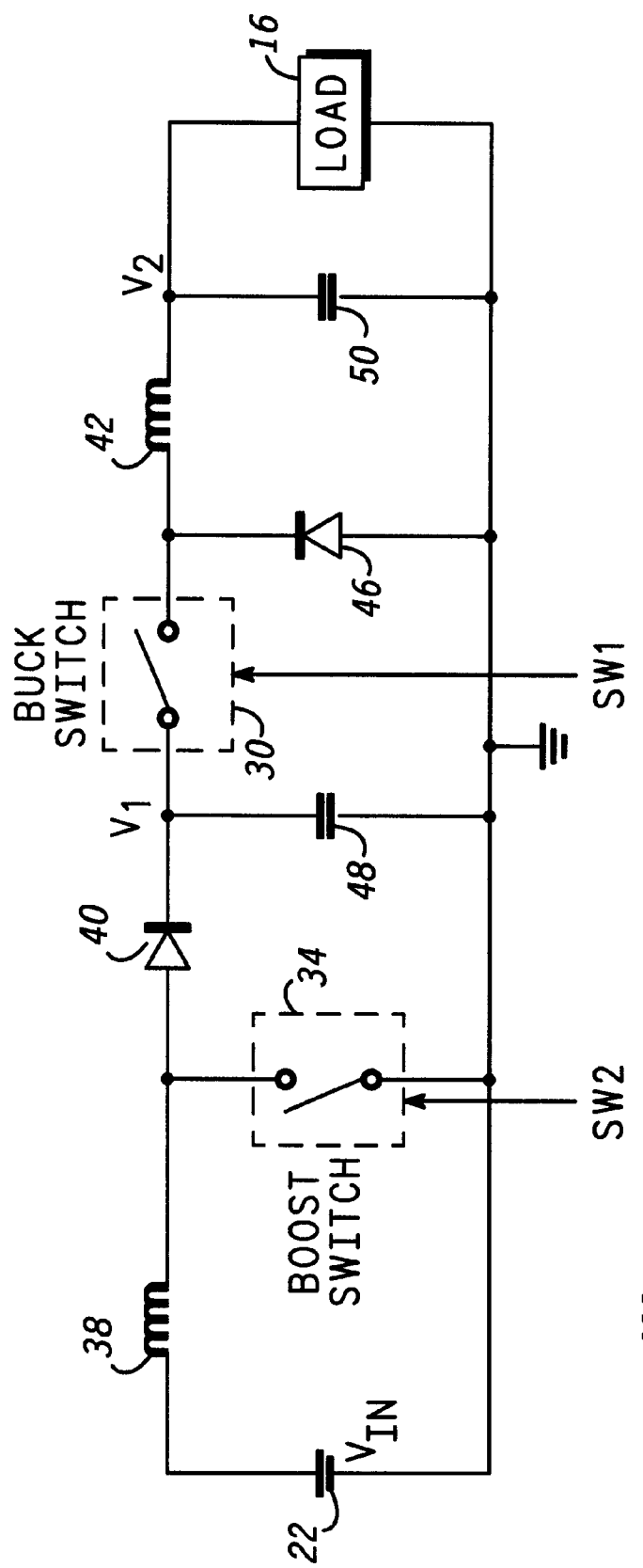
FIG. 4 is an alternative embodiment of a buck boost power converter consistent with the present invention.

Considering BOB converter 20 of FIG. 1 in conjunction with the equivalent circuits of FIG. 2 and FIG. 3, one can readily recognize that BOB converter 20 is configured as a Buck converter cascaded with a Boost converter with both converters sharing a common output low pass filter. In the arrangement of FIG. 1, the Buck converter is connected to the input followed by the Boost converter. However, those skilled in the art will recognize that other configurations are possible. While BOB converter 20 cascades first a Buck converter then a Boost converter, FIG. 4 illustrates an alternative embodiment 400 in which a Boost converter is connected to $V_{in}$ and is cascaded with a Buck converter sharing a common output low pass filter scheme. Circuit arrangement 400 utilizes approximately the same number of components configured slightly differently. In this arrangement, inductor 38 is connected from input source $V_{in}$ 22 to the anode of diode 40. The cathode of diode 40, presenting voltage $V_1$, is connected to one side of Buck switch 30 with the other side of Buck switch 30 connected to inductor 42. The second side of inductor 42 is at $V_2$ which supplies load 16. Capacitor 50 is connected between the junction of inductor 42 and load 16 to ground. The cathode of diode 46 is connected from the junction of inductor 42 and Buck switch 30 with the anode connected to ground. Capacitor 48 is connected from the cathode of diode 40 to ground. Boost switch 34 is connected between the anode of diode 40 and ground. Circuit 400 thus provides essentially identical functionality to that of Buck or Boost circuit 20 and is essentially interchangeable and equivalent thereto. Those having ordinary skill in the art will recognize that other equivalent circuit arrangements can also be formulated to take advantage of the Buck or Boost architecture and control of the present invention. The configurations shown seek to minimize the number of magnetic components to facilitate miniaturization and favor the advantages of integration of the circuit components over use of magnetic elements. But, other configurations may be used for other applications without departing from the invention.

Figure 5:
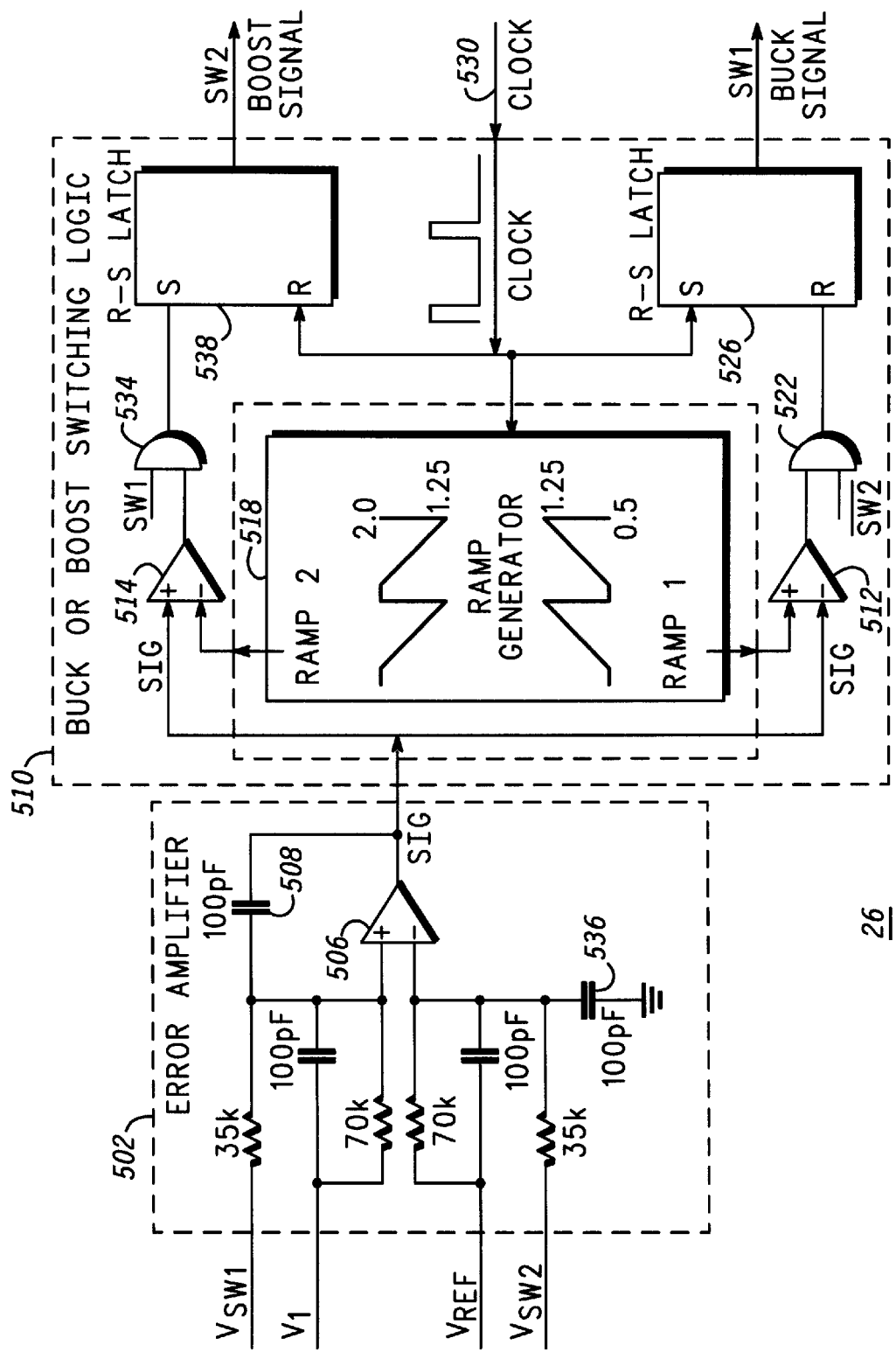
FIG. 5 is a more detailed schematic of the error amplifier and switching logic of the Buck or Boost Converter control circuit 26 of FIG. 1.

Referring now to FIG. 5, one embodiment of a Buck or Boost control circuit 26 is illustrated utilizing primarily conventional analog and digital circuit technology. Buck or Boost control circuit 26 includes an analog error amplifier 502 that combines signals $V_{sw1}$, $V_1$, $V_{ref}$ and $V_{sw2}$ with appropriate weightings as shown, as input to a differentially configured operational amplifier 506. A capacitor 508 provides capacitor feedback from the output of the operational amplifier to the inverting input. The resistor and capacitor values shown are again selected for appropriate operation at approximately 1 MHz switching rate for Sw1 and Sw2, and to provide for the design constraints described above. These component values should not be considered limiting. The resistor values are selected to provide approximately a two to one weighting of $V_1$ to $V_{sw1}$ and $V_{ref}$ to $V_{sw2}$.

The output of operational amplifier 506 produces an error signal Sig which represents the error between signal $V_1$ and a weighted function of $V_{ref}$. This signal Sig is provided to BOB switching logic 510. The value of error signal Sig can be approximated by the equation:

$$Sig = k_1(V_{ref} - V_1) + \frac{\int [(V_{sw2} - V_{sw1}) + k_2(V_{ref} - V_1)]dt}{T_S}, \quad [4]$$

where $T_s$ is a switching cycle time. The switching frequency $F_s = 1/T_s$. Constants $k_1$ and $k_2$ are design chosen constants that determine the feedback gain through the error amplifier 502. The values of $k_1$ and $k_2$ correspond to output feedback: proportional and integral terms respectively. The choice of $k_1$ and $k_2$ is governed by choice of the output L-C filter. Standard design tools for stability analysis such as Bode plots can be used in this design. The feedback gain corresponding to switch voltage feedback is chosen to meet the equal slope criteria. These constants are associated with the error amplifier design and can be selected by the designer to appropriately scale $V_{ref}$ to minimize error in the output voltage $V_2$.

BOB switching logic 510 receives signal Sig from error amplifier 502 as an inverting input to a comparator 512 as well as a non-inverting input to a comparator 514. A Ramp Generator 518 generates a positive going Ramp signal labeled Ramp1 which is applied to the non-inverting input of comparator 512. Ramp Generator 518 also generates a negative going Ramp Signal labeled Ramp2 which is applied to the inverting input of comparator 514. A clock signal 530 is also provided. The ramp signals converge at the end of each clock cycle and abruptly reset to a fixed value during the high state of the clock signal 530. In this manner comparators 512 and 514 switch output states whenever the error signal Sig intersects either Ramp1 or Ramp2 respectively. When the error signal Sig intersects Ramp1, the output state of comparator 512 switches. This output is applied to an AND gate 522 with the output of AND gate 522 driving the reset input of an R S Latch 526. Clock signal 530, which resets Ramp generator 518, is applied to the set input of R S Latch 526. The output of R S Latch 526 provides the Buck signal $S_{w1}$, which drives Buck switch 30 of Buck or Boost converter 20.

In a similar manner, when Ramp2 and error signal Sig intersect, the output state of comparator 514 changes. This output of comparator 514 is applied to AND gate 534 whose output drives the set input of an R S Latch 538. The reset input of R S Latch 538 is driven by clock signal 530. The output of R S Latch produces Boost signal $S_{w2}$, which drives Boost switch 34 of BOB converter 20. Signal $S_{w2}$ is inverted and applied to the second input of AND gate 522, while $S_{w1}$ is applied directly to the second input of AND gate 534. Using this circuit configuration, the BOB converter operates in either a Buck or Boost mode of operation with minimal crossover distortion. At the first of each switch cycle, the Boost switch starts Off and the Buck switch starts On. At this point there is a rising Ramp signal Ramp1 for the Buck control and a falling Ramp, Ramp2, for the Boost control. The error amplifier output Sig is compared with the two Ramps. Sig intersects one of the two Ramps setting either Buck or Boost mode for that cycle. Since the two Ramps intersect at the end of the switching cycle, only one of the two modes is chosen in each cycle. The Ramp signals can be approximately represented by the following equations:

$$Ramp_1 = dc + \frac{V_{in}}{T_s}(t - nT_s) = dc + V_{in}\left(\text{mod}\left(\frac{t}{T_S}\right)\right), \text{ and} \quad [5]$$

$$Ramp_2 = dc + 2V_{in} - \frac{V_{in}}{T_s}(t - nT_s) = dc + V_{in}\left(2 - \text{mod}\left(\frac{t}{T_S}\right)\right), \quad [6]$$

where dc is a dc reference voltage level.

The above control arrangement provides for a smooth transition between the Buck mode and the Boost mode of operation to prevent significant crossover distortion while tracking signals close to the Nyquist rate. Since only one of the Buck or Boost mode is operational at any given time, switching losses in the switches are minimized to enhance overall efficiency. The controller 26 operates to set either the Buck or Boost mode at the beginning of each clock cycle. At the beginning of the cycle, the Boost converter is off and the Buck converter is on, and the ramps intersect at the end of each clock cycle to assure that only one or the other will operate at any given time. The error signal Sig's relationship to the ramps then determines which of the two modes of operation will be used on a cycle by cycle basis.

In an alternative embodiment, the logic can be rearranged to start each cycle with the Boost converter and the Buck converter in different modes without departing from the present invention.

Figure 6:
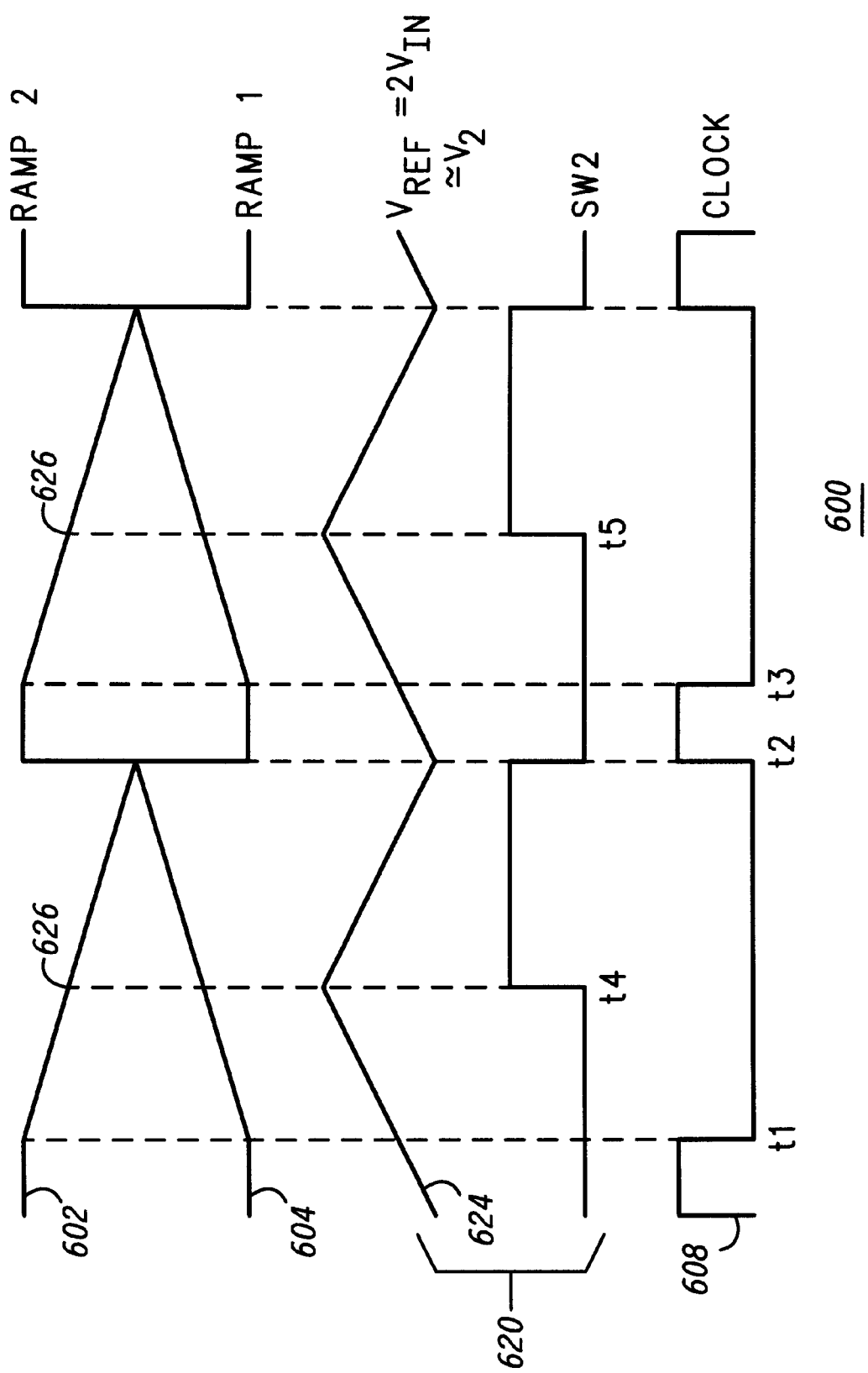
FIGS. 6 and 7 are graphs of several of the waveforms of signals present in the buck or boost circuit arrangement of FIG. 1 and FIG. 5 when operating in two exemplary steady state modes.

Referring now to FIG. 6, a set of voltage waveforms 600 illustrates the steady state operation of the present BOB converter 20 in conjunction with BOB control circuit 26 under steady state operational conditions in the Boost mode. Curve 602 represents the signal Ramp2 generated by Ramp Generator 518 while curve 604 represents a Ramp Signal referred to herein as Ramp1 generated by Ramp Generator 518. The clock signal is shown as curve 608. On the falling edge of clock signal 608, illustrated first occurring at time $t_1$, Ramp signal 602 begins declining while Ramp signal 604 begins increasing. At time $t_2$, the rising edge of the next clock pulse, Ramp signals Ramp1 and Ramp2 abruptly transition to their starting points and hold that value until time $t_3$. At time $t_3$, the falling edge of clock signal 608, again the Ramp signals Ramp1 and Ramp2 begin increasing and decreasing respectively. The cycle then repeats itself. The ramp signals are thus synchronized with the clock signal 608.

In the example illustrated in curves 620, the output voltage $V_2$ is to have a value of two times the input voltage $V_{in}$. Curve 624 represents the error signal Sig which rises until time $t_4$ where it intersects the falling value of Ramp2 shown as curve 602 at point 626. This causes comparator 514 to change output states, and SW2 to change states. At this point, Sig curve 624 begins declining until time $t_2$ is reached and the rising clock edge causes the value of Sig to begin increasing again. At point 626 and time $t_5$, curve 624 and curve 602 again intersect at a point 626, comparator 514 switches output state and curve 624 again begins declining after time $t_5$. When curves 624 and 602 intersect at times $t_4$ and $t_5$, BOB switching logic 510 generates a change in state of switching signal $S_{w2}$ so that at time $t_4$ signal $S_{w2}$ goes from low to high. This closes Boost switch 34 until time $t_2$ when a clock transition resets latch 538 of BOB switching logic 510 to cause the signal $S_2$ to go from high to low. The process repeats itself at time $t_5$ where, again, curves 602 and 624 intersect at 626 to cause BOB switching logic 510 to produce a low to high transition of signal $S_{w2}$, and so on. In this manner, a switching signal $S_{w2}$ having approximately a 50% duty cycle is applied to Boost switch 34 to produce a value of $V_2$ equaling twice the input voltage $V_{in}$. Since this example illustrates a steady state condition of operation exclusively in the Boost mode, it will be appreciated that Buck switch 30 remains closed ($D_1$=1) during this example.

Figure 7:
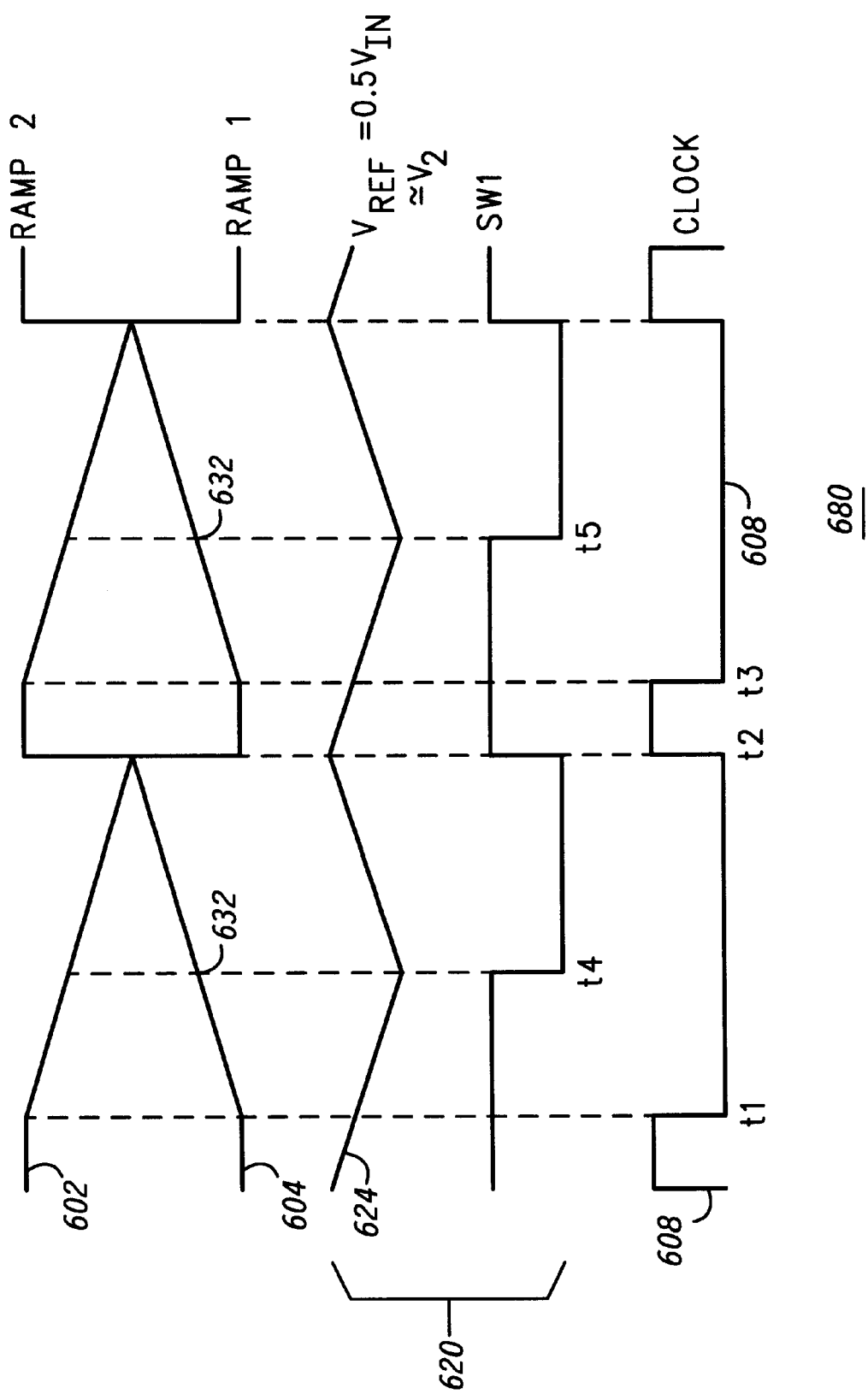

A similar example of the steady state operation in Buck mode is illustrated in FIG. 7 in example 680. Curves 602, 604 and 608 are identical to those of FIG. 6. The operation in the Buck mode is shown in example curves 650. In this example, the feedback signal Sig is shown as curve 624, but with $V_{ref}$=0.5×the input voltage $V_{in}$, which approximately equals $V_2$. Curve 624 declines until time $t_4$ where curve 624 intersects curve 604 at 632. When this intersection occurs at time $t_4$, comparator 512 switches output state causing a transition in Buck switching signal $S_{w1}$ from high to low causing the Buck switch 30 to open. Curve 624 then begins increasing at time $t_4$ until it reaches time $t_2$ where a new clock cycle begins again causing a transition in state of signal $S_{w1}$ from low to high. Signal 624 then declines from time $t_2$ to time $t_5$ where again an intersection of curve 624 with 604 occurs at point 632. This intersection of signals causes a change in state of comparator 512 and a transition in signal $S_{w1}$ from high to low, and so on. During the time that signal $S_{w1}$ is switching Buck switch 30, Boost switch 34 remains in the open position ($D_2$=0), so that the Buck or Boost converter 20 operates only in the Buck mode.

Figure 8:
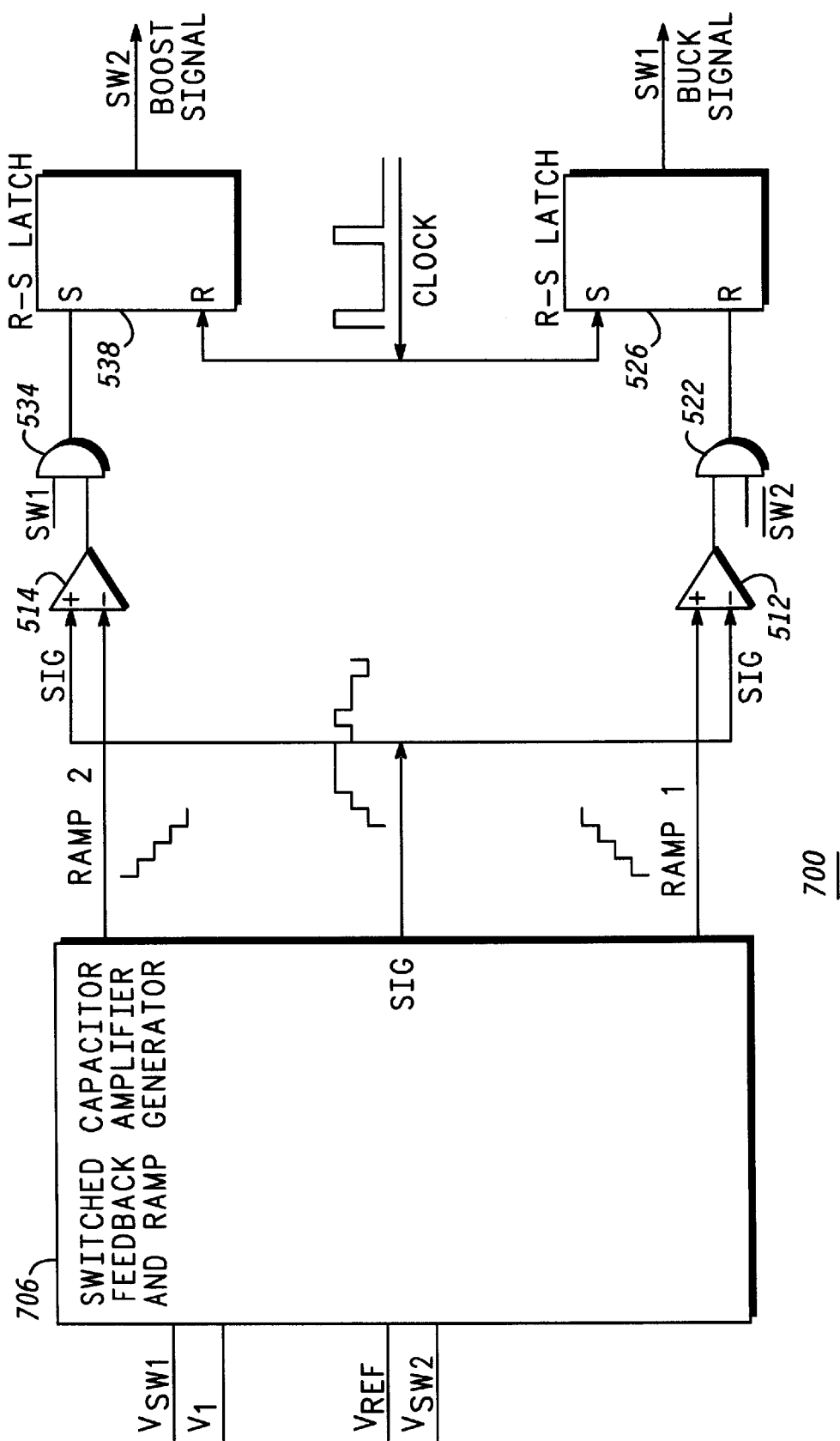
FIG. 8 is a schematic diagram illustrating substitution of a switched capacitor implementation of the error amplifier and switching logic of FIG. 4.

The circuitry described above utilizes relatively smooth ramp and Sig curves generated by analog circuitry. However, those of ordinary skill in the art will recognize that other embodiments are possible, for example, those which utilize a staircase (or other) approximation for Ramp signals Ramp1 and Ramp2 as well as discrete value approximations for the error signal Sig. Circuit 700 of FIG. 8 illustrates in block diagram form the use of a switched capacitor feedback amplifier and Ramp generator circuit 706 to produce staircase Ramp signals Ramp1 and Ramp2 and discrete error signal Sig. A switched capacitor implementation of these circuit components presents a number of implementation advantages in some cases. By using switched capacitor implementations, the scaled size of integrated capacitors can be utilized to control the step size for Ramp1 and Ramp2 while minimizing the need for external components. Moreover, using differential designs, a differential output can be utilized to achieve high levels of noise immunity and immunity to common mode signals.

Figure 9:
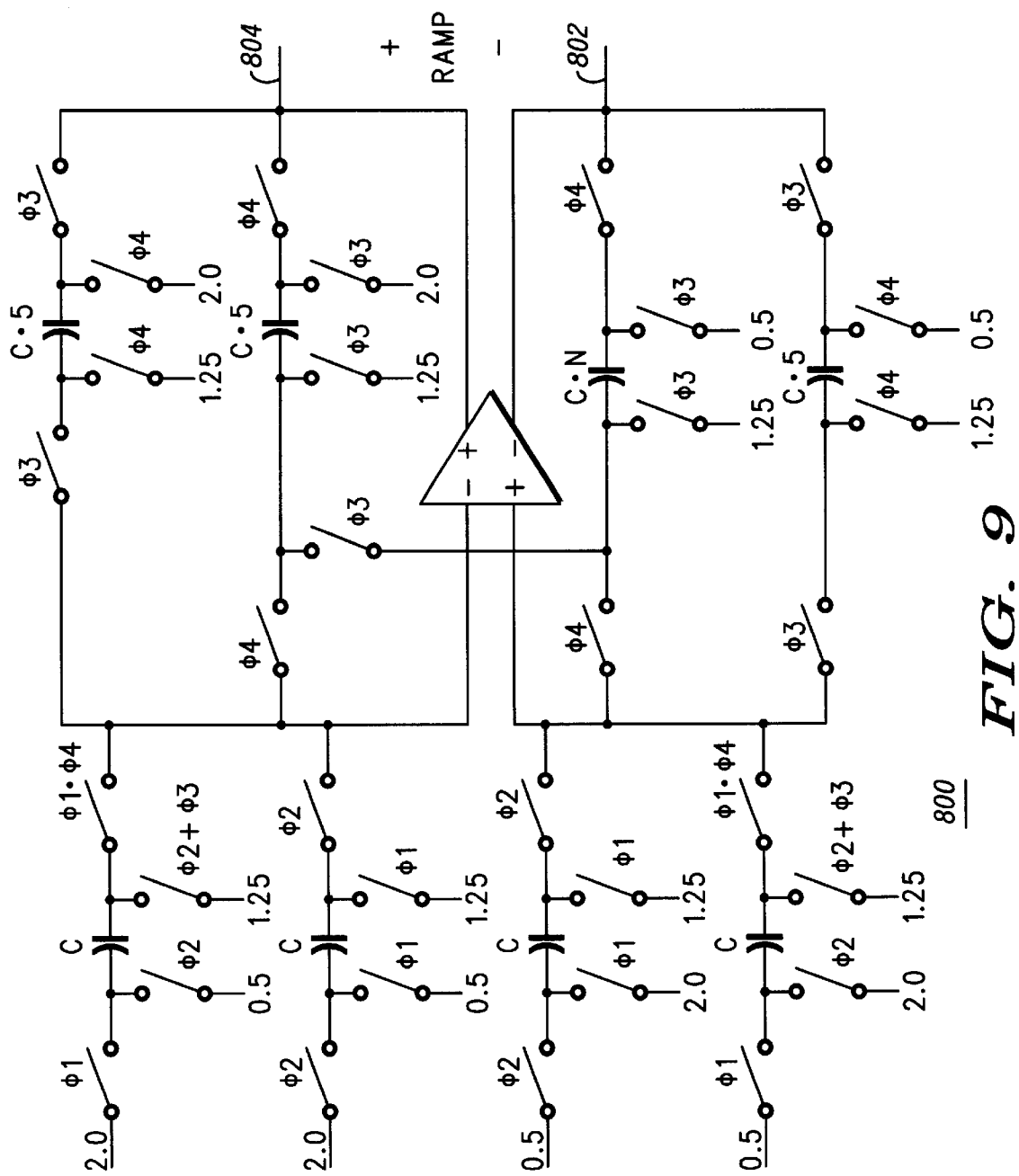
FIG. 9 illustrates one embodiment of a switched capacitor implementation of a ramp generator.

FIG. 9 illustrates an implementation of a Ramp generator using switched capacitor techniques based upon a four-phase clock shown as FIG. 10. Referring now to FIG. 9, a switched capacitor implementation of a Ramp generator suitable for use with the present invention is illustrated. This Ramp generator generates a staircase approximation of a differential Ramp signal. In the differential implementation, Ramp1 can be interpreted as the Ramp signal taken from inverting output 802 to non-inverting output 804, whereas the Ramp signal Ramp2 can be interpreted as the differential Ramp signal from non-inverting Ramp output 804 to inverting Ramp output 802. That is, only a single differential Ramp signal is generated but it can be interpreted as either Ramp1 or Ramp 2 depending upon the polarity. The Ramp generator is, in essence, a switched capacitor implementation of a differential integrator circuit that integrates DC values applied at the inputs. The DC values applied at the input are 0.5V, 1.25V and 2V applied through phase controlled switches at each of the integrator inputs. In a switched capacitor implementation of an integrator, resistors which would appear at the input of an analog integrator are replaced with capacitors and switches in a manner known to those of ordinary skill in the art. The Ramp is reset by the third phase $\phi_3$ of the four-phase clock signal as shown in FIG. 10. This third phase is approximately equivalent to clock signal 530 as shown in FIG. 5. The fourth phase $\phi_4$ is approximately the inverse of clock signal 530 with a small dead zone surrounding the clock transitions to prevent shorting signals. In a similar manner, small dead zones surround the clock transitions for the first and second phase clocks $\phi_1$ and $\phi_2$ again to prevent signals from shorting to one another. The capacitors and the switch phases $\phi_1$ and $\phi_2$ implement resistors. A switched capacitor integrator integrating a dc voltage creates the ramp. The $\phi_3$ and $\phi_4$ phases create the ramp reset mechanism.

Referring now to circuit 1000 of FIG. 11, a switched capacitor implementation of an error amplifier is shown. Again, the error amplifier in the switched capacitor embodiment is implemented as a differential amplifier. Thus, with reference to the error amplifier 502 of FIG. 5, the four input resistors are replaced with switches and capacitors. Capacitor 536 to ground in FIG. 5 is replaced by a feedback capacitor 1002 in FIG. 11 and feedback capacitor 1004 corresponds to feedback capacitor 508 of FIG. 5. The output error signal is again a differential signal Sig for enhanced noise immunity. Each of the input voltages (for example $V_1$) is taken as a differential input rather than a single ended voltage thus requiring two connections per voltage. In the example $V_1$, the signal $V_1^+$ corresponds to $V_1$ and the signal $V_1^-$ correspond to the ground potential. With reference to FIG. 1, essentially the differential signal $V_1$ is taken as the voltage across capacitor 48 with $V_1^-$ being the potential at the bottom of capacitor 48 and $V_1^+$ being the potential at the top of capacitor 48. The proportional feedback terms of equation [4] are obtained by the ratio of the input capacitor and the feedback capacitor. The integral feedback terms of equation [4] are obtained by the switched capacitors and the feedback capacitors. Transformation of conventional analog circuits to switched capacitor differential implementations are known and within the skill of those of ordinary skill in the art.

Thus, the present invention provides for a Buck or Boost converter circuit and accompanying control circuit that produces high efficiency voltage conversion. The control circuit supplies the Buck switching signal to the Buck switch arrangement to produce an output voltage less than the input voltage (Bucked) and the Boost switching signal is supplied to the Boost switching arrangement to produce a Boosted input voltage. At any given time only one of the Buck switching signal and the Boost switching signal is applied with either the Buck or Boost circuit not receiving the switching signal being turned off. The feedback arrangement shown provides control of the duty cycle of the Buck switching signal or the Boost switching signal to control the instantaneous value of the output voltage $V_2$. The signal $V_{ref}$, which is related to the baseband signal of the RF signal to be transmitted by the RF power amplifier 16, drives the Buck or Boost control circuit in a manner that enables the Buck or Boost converter to produce an output voltage $V_2$ that closely tracks the envelope of the RF signal to be transmitted by the RF power amplifier 16. Those of ordinary skill in the art will recognize many variations in ways to implement the present invention without being restricted to the particular circuit configurations illustrated herein, which should be considered exemplary.

Those of ordinary skill in the art will recognize that the present invention has been described in terms of exemplary embodiments based upon use of a hard wired logic circuit and analog, or switched capacitor error amplifiers and ramp generators. However, the invention should not be so limited, since the present invention could be implemented using computer component equivalents such as special purpose hardware and/or dedicated or general purpose processors which are equivalents to the invention as described and claimed. Similarly, general purpose computers, microprocessor based computers, micro-controllers, optical computers, analog computers, dedicated processors and/or dedicated hard wired logic may be used to construct alternative equivalent embodiments the logic circuits, error amplifiers, and ramp generators of the present invention. Moreover, although linear or staircase approximations have been disclosed for the ramp circuits used to control operation of the BOB converter of the present invention, other wave shapes can be adapted to use with the present invention.

Those of ordinary skill in the art will appreciate that the program steps used to implement the embodiments described above can be implemented using disc storage as well as other forms of storage including Read Only Memory (ROM) devices, Random Access Memory (RAM) devices; optical storage elements, magnetic storage elements, magneto-optical storage elements, flash memory, core memory and/or other equivalent storage technologies without departing from the present invention. Such alternative storage devices should be considered equivalents.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A buck or boost voltage converter, comprising:
    a buck converter having a buck switch that selectively applies input voltage to a first storage element, and produces an output voltage less than the input voltage;
    a boost converter, cascaded with the buck converter, having a boost switch that receives and boosts an input voltage and selectively applies either the boosted input voltage or ground to a second storage element to produce an output voltage greater than the input voltage;
    a low pass filter receiving and filtering an output voltage from the cascaded buck converter and boost converter, to produce a filtered output voltage; and
    a control circuit that supplies a buck switching signal to the buck switch to produce a bucked voltage, and a boost switching signal to the boost switch to produce a boosted voltage, the control circuit activating only one of the buck switching signal and boost switching signal during each of a plurality of clock cycles, and wherein crossover distortion is substantially eliminated.

2. The buck or boost voltage converter of claim 1, wherein the control circuit receives an error signal, a first ramp signal, and a second ramp signal; and further comprising:
    a first comparison circuit that compares the first ramp signal with the error signal and produces an output change when the first ramp signal intersects the error signal;
    a second comparison circuit that compares the second ramp signal with the error signal and produces an output change when the second ramp signal intersects the error signal;
    a logic circuit responsive to the outputs of the first and second comparison circuits to turn off the boost converter and produce a buck switching signal when the error signal is less than the first ramp signal, and to turn off the buck converter and produce a boost switching signal when the error signal is greater than the second ramp signal; and
    wherein the buck switching signal and the boost switching signal have duty cycles controlled by the output change from the first and second comparison circuits respectively.

3. The buck or boost voltage converter of claim 2, wherein the first and second ramp signals are generated by a ramp generator circuit that generates first and second analog ramp signals.

4. The buck or boost voltage converter of claim 2, wherein the first and second ramp signals are generated by a switched capacitor ramp generator circuit that generates a stair step approximation of the first and second ramp signals.

5. The buck or boost voltage converter of claim 2, further comprising:
    an error amplifier supplying the error signal, wherein the error signal represents a difference between the output voltage and a reference waveform derived from a baseband portion of an RF signal; and
    an RF power amplifier receiving the filtered output voltage as a power supply voltage and the RF signal as an input signal to be amplified.

6. The buck or boost voltage converter of claim 5, wherein the error amplifier comprises a switched capacitor error amplifier.

7. The buck or boost voltage converter of claim 5, wherein the error amplifier comprises an analog error amplifier.

8. A radio transmitter, comprising:
    a buck or boost voltage converter having a buck switch and a boost switch;
    a signal processor that generates a scaled reference signal derived from a baseband portion of an RF signal to be transmitted;

a control circuit, receiving a clock signal that establishes a series of clock cycles, the control circuit receiving the scaled reference signal and selectively applies switching signals to only one of the buck switch and the boost switch during each clock cycle to produce an output voltage from the buck or boost voltage converter, the output voltage having a wave shape approximating that of the scaled reference signal, and wherein crossover distortion is substantially eliminated; and a radio frequency power amplifier receiving the output voltage of the buck or boost voltage converter as a supply voltage thereto and transmitting the RF signal.

9. A buck or boost voltage converter, comprising:

a buck converter having a buck switch, that selectively applies input voltage to a first storage element, and produces an output voltage less than the input voltage;

a boost converter, cascaded with the buck converter, having a boost switch, the boost converter receiving and boosting an input voltage and selectively applies either the boosted input voltage or ground to a second storage element to produce an output voltage greater than the input voltage;

a low pass filter receiving and filtering an output voltage from the cascaded buck converter and boost converter, to produce a filtered output voltage;

a switched capacitor ramp generator circuit generating a first and a second ramp signal;

a switched capacitor error amplifier supplying an error signal, wherein the error signal represents a difference between the output voltage and a signal derived from a baseband portion of an RF signal;

a control circuit, receiving a clock signal that establishes a series of clock cycles, the control circuit supplying a buck switching signal to the buck switch to produce a bucked voltage, and a boost switching signal to the boost switch to produce a boosted voltage, the control circuit supplying only one of the buck switching signal and boost switching during each clock cycle, and wherein crossover distortion is substantially eliminated;

the control circuit receiving the error signal, the first ramp signal, and the second ramp signal, and further comprising:

a first comparison circuit that compares the first ramp signal with the error signal and produces an output change when the first ramp signal intersects the error signal;

a second comparison circuit that compares the second ramp signal with the error signal and produces an output change when the second ramp signal intersects the error signal;

a logic circuit responsive to the outputs of the first and second comparison circuits to turn off the boost converter and produce a buck switching signal when the error signal is less than the first ramp signal, and to produce a boost switching signal when the error signal is greater than the input second ramp signal;

wherein the buck switching signal and the boost switching signal have duty cycles controlled by the output change from the first and second comparison circuits respectively; and an RF power amplifier receiving the filtered output voltage as a power supply voltage and the RF signal as an input signal to be amplified.

* * * * *